(12) United States Patent
Tang et al.

(10) Patent No.: US 6,384,529 B2
(45) Date of Patent: *May 7, 2002

(54) FULL COLOR ACTIVE MATRIX ORGANIC ELECTROLUMINESCENT DISPLAY PANEL HAVING AN INTEGRATED SHADOW MASK

(75) Inventors: Ching W. Tang, Rochester; Kee-Chuan Pan, Pittsford, both of NY (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,298

(22) Filed: Nov. 18, 1998

(51) Int. Cl.[7] ............................. H05B 33/14; H05B 33/10
(52) U.S. Cl. ......................... 313/506; 313/504; 313/505
(58) Field of Search .................... 313/498, 500, 313/504, 505, 506; 315/169.3

(56) References Cited

U.S. PATENT DOCUMENTS

| 5,130,603 A | 7/1992 | Takailin et al. |
| 5,141,671 A | 8/1992 | Bryan et al. |
| 5,294,869 A | 3/1994 | Tang et al. |
| 5,294,870 A | 3/1994 | Tang et al. |
| 5,550,066 A | 8/1996 | Tang et al. |
| 5,645,948 A | 7/1997 | Shi et al. |
| 5,742,129 A | * 4/1998 | Nagayama et al. .......... 315/167 |
| 5,747,928 A | * 5/1998 | Shanks et al. ............... 313/498 |
| 5,949,188 A | * 9/1999 | Leising et al. ............... 313/505 |
| 6,005,344 A | * 12/1999 | Fleming ...................... 313/498 |
| 6,137,220 A | * 10/2000 | Nagayama et al. .......... 313/504 |

* cited by examiner

Primary Examiner—Nimeshkumar D. Patel
Assistant Examiner—Karabi Guharay
(74) Attorney, Agent, or Firm—Raymond L. Owens

(57) ABSTRACT

A full-color active matrix organic light-emitting color display panel is disclosed which has an integrated shadow mask structure for patterning arrays of color subpixels. The in-situ shadow mask structure is prepatterned on the display substrate by conventional photolithography, and provides a simple, self-alignment feature for successive deposition of color organic electroluminescent (EL) media on designated color subpixel areas. The pillar structure of the shadow mask are particularly effective in the fabrication of high-resolution full-color organic light-emitting diode displays having either color conversion layers or individual red, green, and blue emissive layers.

18 Claims, 14 Drawing Sheets

FULL COLOR ACTIVE MATRIX ORGANIC ELECTROLUMINESCENT DISPLAY PANEL HAVING AN INTEGRATED SHADOW MASK

FIELD OF THE INVENTION

The present invention relates to color organic light-emitting displays having a tri-color light-emitting pixel pattern.

BACKGROUND OF THE INVENTION

Tang et al. in U.S. Pat. Nos. 5,294,869 and 5,294,870 recognized the advantages of constructing organic electroluminescent multicolor image display devices by providing integrated shadow masks for the generation of laterally separated pixels capable of emitting light of different hue. Such shadow masks are comprised of walls, pillars, or ribs which are formed on a support or a substrate in a predetermined pattern, and having a height dimension selected to cast a shadow with respect to an obliquely incident vapor stream. These shadow masks separate each color subpixel from an adjacent color subpixel.

Tang et al., U.S. Pat. No. 5,550,066 describes a method of fabricating an active-matrix organic electroluminescent panel based on polysilicon thin-film transistor (TFT) arrays. With an active-matrix TFT array and integrated drivers on the substrate, organic EL displays provide many desirable attributes not commonly found in any one class of conventional displays. These attributes are high resolution, compact display geometry, self luminance, high efficiency, and a wide viewing angle. Other display technologies, in comparison, have certain deficiencies. For instance, the most common active-matrix liquid crystal displays have limited viewing angles and require a back-light for illumination. The plasma displays are self emissive, but are not power efficient. The inorganic thin-film EL displays are rugged and compact, but they require high drive voltage and are not efficient.

Tang et al., U.S. Pat. No. 5,550,066 describes the fabrication processes for an active-matrix array based on polysilicon Tufts and its integration with a monochromatic organic EL device. The integration process for the monochromatic EL device is relatively simple, involving only the deposition of the organic EL medium directly on the substrate pre-patterned with TFT pixels and necessary bus electrodes and drivers. The EL medium refers to the organic layers constituting the EL device. For full-color, active-matrix organic EL display panel providing red, green and blue colors, the EL medium requires patterning into separate and adjacent color pixels in relationship to the active matrix TFT pixels. This patterning procedure can be quite complex depending on the resolution requirements and the configuration of the EL device. This patent describes an organic color EL displays fabricated with an integrated shadow mask on the display which provides a way of patterning the organic EL medium into red, green and blue color pixels.

SUMMARY OF THE INVENTION

The present invention provides a full-color active-matrix addressable organic electroluminescent display panel.

Accordingly, it is an object of the present invention to provide a high resolution, full-color, organic electroluminescent display requiring only one level of photolithography in generating a tri-color (RGB) pixel pattern.

In one aspect of the present invention, this object is achieved in an organic electroluminescent color display, comprising:

a) a substrate;
b) a plurality of color pixels formed on the substrate;
c) each color pixel containing three primary color (red, green, and blue) subpixels;
d) an active matrix electrical addressing element associated with each color subpixel;
e) an integrated shadow mask for forming the color subpixels and includes a plurality of pillar structures erected on the substrate;
f) the pillar structures having a geometric arrangement which permits the formation of each color subpixel independent of the formation of the other two color subpixels and wherein the formation of each color subpixel is provided by a line-of-sight vapor deposition for selective patterning the color subpixel; and
g) a common light-transmissive electrode over the plurality of color pixels.

In another aspect of the present invention, this object is achieved in an organic light-emitting color display, comprising:

a) a substrate;
b) a plurality of color pixels formed on the substrate;
c) each color pixel containing three primary color (red, green, and blue) subpixels;
d) an active matrix electrical addressing element associated with each color subpixel;
e) an integrated shadow mask for forming the color subpixels includes a plurality of pillar structures erected on the substrate and wherein the pillar structures having a geometric arrangement which permits the formation of each color subpixel independent of the formation of the other two color subpixels and wherein the formation of each color subpixel is provided by a line-of-sight vapor deposition for selective patterning the color changing medium;
f) each color subpixel having a short wavelength organic electroluminescent (EL) emitter and a fluorescent color conversion layer formed over the EL emitter; and
g) a common light-transmissive electrode over the EL emitter.

In a further aspect of the present invention, this object is achieved in an organic light-emitting color display, comprising:

a) a substrate;
b) a plurality of color pixels formed on the substrate;
c) each color pixel containing three primary color (red, green, and blue) subpixels;
d) an active matrix electrical addressing element associated with each color subpixel;
e) an integrated shadow mask for forming the color subpixels includes a plurality of pillar structures erected on the substrate;
f) the pillar structures having a geometric arrangement which permits the formation of each color subpixel independent of the formation of the other two color subpixels; wherein
g) each color subpixel having an organic electroluminescent (EL) emitter with an emissive layer capable of producing a primary color; wherein
h) the formation of each color subpixel is provided by a line-of-sight vapor deposition for selective patterning the emissive layer of the EL emitter; and
i) a common light-transmissive electrode over the EL emitter.

ADVANTAGES

An advantage of this invention is that the fabrication of a full-color active-matrix organic light-emitting diode (OLED) display panel is simple and economical. The fabrication requires only one additional level of photolithography for the construction of an integrated shadow mask and for the color subpixel patterning scheme.

The integrated shadow mask (also referred to as an in-situ shadow mask) ensures that the deposited fluorescent color conversion layer is self-aligned with respect to a designated color subpixel area. This self-alignment feature is highly precise and therefore it is particularly useful for the fabrication of high-resolution color OLED display panels. Color pixel pitch of less than 10 micrometers can be readily achieved by the pillar structure shadow masks of the invention.

Excellent optical coupling between a short wavelength OLED emitter and a fluorescent color conversion or a fluorescent color changing layer is ensured, since the fluorescent layer is formed within a fraction of a micrometer over the short wavelength light-emitting layer. Thus, efficient color conversion from near ultraviolet or blue to green and from near ultraviolet or blue to red can be accomplished.

Vapor deposition for producing a color conversion fluorescent layer is fully compatible with OLED device fabrication. In particular, the exposure of an ambient-sensitive OLED device to ambient air throughout the entire production cycle is not necessary, thus avoiding the possibility of device degradation due to the elements of air and/or moisture. The color OLED panel fabrication can proceed in a vacuum deposition chamber without a vacuum break, starting with the deposition of the blue emitting OLED array to the deposition of the fluorescent color conversion layers.

The integrated shadow mask structures can also be used to provide full-color display panels having red, green, and blue light-emitting pixels (or subpixels) formed directly from layers of organic electroluminescent (EL) materials.

BRIEF DESCRIPTION OF THE DRAWINGS

FIGS. 1–6 show the fabrication of a full-color active-matrix organic EL display panel using integrated shadow mask structures to pattern color conversion (color changing) layers in accordance with the present invention, wherein FIG. 1 is a schematic side view of a subpixel arrangement over a substrate and including subpixel electrodes and associated active matrix electrical addressing transistor elements;

FIG. 2 shows an electrically insulative passivation layer covering the transistor addressing elements and providing an exposed portion of each subpixel electrode;

FIG. 3 shows a first embodiment of an integrated shadow mask structure erected on the passivation layer at designated locations;

FIG. 4 depicts a blue light-emitting organic electroluminescent (EL) layer formed over each subpixel, and a common light-transmissive electrode formed over the blue light-emitting layer;

FIG. 5 shows the deposition of a fluorescent green color conversion layer by vapor deposition from an oblique angle with respect to the shadow mask and the consequent formation of a green color subpixel; and FIG. 6 shows the deposition of a fluorescent red color conversion layer by vapor deposition from an oblique angle (in opposite direction) with respect to the shadow mask and the consequent formation of a red color subpixel.

FIGS. 7–10 show the fabrication of a full-color active matrix organic EL display panel using integrated shadow mask structures of a second embodiment to pattern color conversion (color changing) layers in accordance with the present invention, wherein FIG. 7 is a schematic side view of a subpixel arrangement over a substrate, subpixel electrodes and associated active matrix electrical addressing elements, an electrically insulative passivation layer, and a second embodiment of an integrated shadow mask structure erected on the passivation layer at designated locations;

FIG. 8 depicts a blue light-emitting organic electroluminescent (EL) layer formed over each subpixel, and a common light-transmissive electrode formed over the blue light-emitting layer;

FIG. 9 shows the deposition of a fluorescent green color conversion layer by vapor deposition from an oblique angle with respect to the shadow mask and the consequent formation of a green color subpixel; and FIG. 10 shows the deposition of a fluorescent red color conversion layer by vapor deposition from an oblique angle (in opposite direction) with respect to the shadow mask and the consequent formation of a red color subpixel;

FIGS. 11–13 show the fabrication of a full-color active matrix organic EL display panel using the integrated shadow mask structures of the second embodiment shown in FIGS. 7–10 to provide subpixel patterns of three primary color emissive layers in accordance with the present invention, wherein FIG. 11 shows the patterned vapor deposition of a green emissive subpixel layer;

FIG. 12 shows the patterned vapor deposition of a red emissive subpixel layer; and FIG. 13 depicts the formation of a blue emissive subpixel layer, and of a common light-transmissive electrode over the light-emissive layers;

FIGS. 14 and 15 are schematic plan views of two different pixels configurations in accordance with the present invention, wherein FIG. 14 shows a color pixel comprising individual primary color (RGB) subpixel areas defined by the integrated shadow mask of the first embodiment, with each individual color subpixel associated with a transistor addressing element; and FIG. 15 depicts a color pixel comprising multiple repeating primary color (RGB) elements defined by the integrated shadow mask of the first embodiment, with color elements of the same color being electrically connected in parallel to a transistor addressing element.

Since device feature dimensions such as layer thicknesses are frequently in sub-micrometer ranges, the drawings are scaled for ease of visualization rather than dimensional accuracy, and in order to preserve clarity of presentation, vapor deposited layers formed over uppermost surfaces of the shadow masks have been omitted.

DETAILED DESCRIPTION OF THE INVENTION

The acronym EL is, in some instances, employed for the term "electroluminescent". The acronym OLED is, in some instances, employed for the term "organic light-emitting diode". The term "pixel" is employed in its art recognized usage to designate an area of an image display array that can be stimulated to emit light independently of other areas. The term "subpixel" is used to designate an area of a pixel which can be addressed to emit light of a particular hue in a multicolor display. The term "multicolor" is employed to describe image displays having a plurality of color pixels in which each color pixel comprises at least two color subpixels, each of which emits light of a different hue. The term "full-color" is employed to describe multicolor image displays having a plurality of color pixels, each comprised of three primary color subpixels, each capable of emitting light in one of the red, green, and blue regions of the visible spectrum. The term "hue" refers to the intensity profile of light emission within the visible spectrum, with different hues exhibiting visually discernible differences in color. The term "light-transmissive" is used to describe an electrode which transmits therethrough at least fifty percent of light throughout a spectral region having a 100 nm width. The term "reflective" is used to describe an electrode which reflects therefrom at least fifty percent of light throughout a spectral region of a 100 nm width.

FIGS. 1–6 indicate schematically the fabrication of a full-color organic light-emitting display panel in accordance with the present invention. It will be appreciated that such a display panel comprises a plurality of organic light-emitting pixels arranged in a two-dimensional array.

Figure 1:
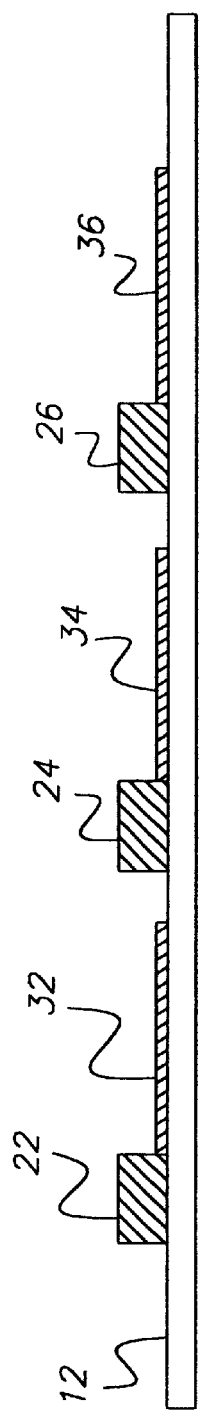

Referring to FIG. 1, first, second, and third laterally spaced subpixel electrodes 32, 34, and 36, respectively, are formed over a substrate 12 for each of the light-emitting pixels. Corresponding electrical addressing elements 22, 24, and 26, respectively, are provided over the substrate so that each of the subpixel electrodes can be electrically addressed with an electrical signal. The substrate 12 can be constructed of a variety of materials which provide physical integrity and electrical characteristics commensurate with the fabrication and operation of a display panel. Particularly preferred materials for the substrate 12 are crystalline silicon, glass, quartz, and ceramic materials. When the substrate 12 is constructed of crystalline silicon, the electrical addressing elements 22, 24, and 26 include, preferably, transistors fabricated by a CMOS process in accordance with processing steps well known in the semiconductor industry. When the substrate 12 is selected to be of glass, quartz, or ceramics, the electrical addressing elements are preferably thin film transistors (TFTs) fabricated in a manner similar to TFTs used in thin film active-matrix liquid crystal display panels. The TFTs can be made of amorphous or of polycrystalline silicon. The subpixel electrodes 32, 34, and 36 of each of pixel are constructed preferably of a reflective electrode material such as, for example, aluminum or an aluminum-silicon alloy.

Figure 2:
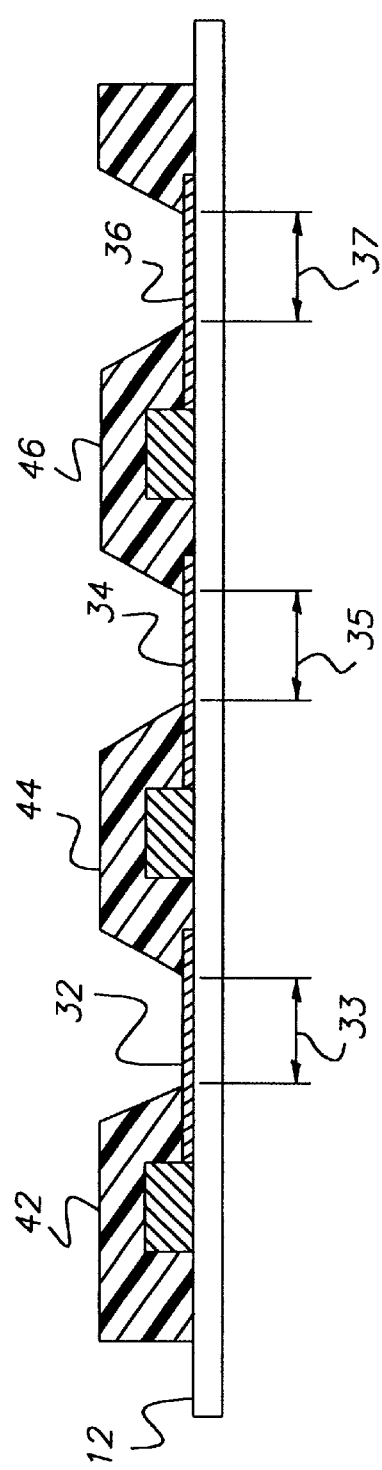

Turning now to FIG. 2, an electrically insulative passivation layer 42, 44, and 46 is formed over each corresponding electrical addressing element and extending over portions of associated subpixel electrodes 32, 34, and 36, respectively, thereby providing exposed portions 33, 35, and 37 of each of these laterally spaced electrodes.

Figure 3:
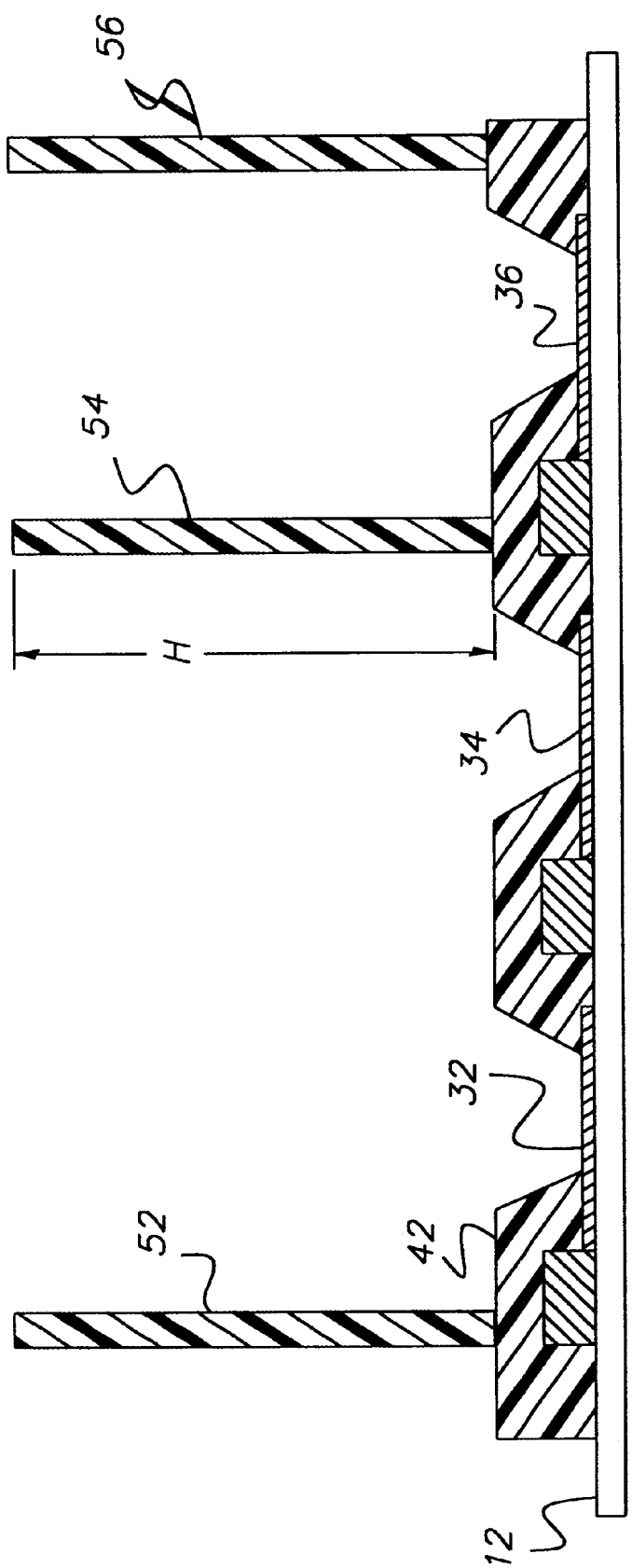

Turning to FIG. 3, a first embodiment of an integrated shadow mask structure is now constructed by forming first, second, and third spaced deposition-controlling rib or pillar structures for each pixel. The ribs or pillars are arranged for each light-emitting pixel so that the first and second subpixel electrodes 32 and 34 are positioned between a first and a second vapor deposition-controlling pillar shadow mask structure 52 and 54, and the third subpixel electrode 36 is positioned between the second pillar 54 and a third pillar structure shadow mask 56. The pillar structures have a height dimension H, which is preferably in a range of 0.5 to 5 times the lateral dimensions of the color subpixel pitch, i.e. the repeat distance between color subpixels.

Following the teachings of Tang et al. in the above referenced U.S. Pat. Nos. 5,294,869 and 5,294,870, the pillars 52, 54, and 56 can be formed from a negative-working photoresist composition which is spin-coated and patterned by a photolithographic processing step. The simplicity and advantage of the arrangement of the pillar structure shadow masks for the vapor deposition of patterned color conversion fluorescent layers will become more readily apparent through the description of the vapor deposition sequences detailed in FIGS. 5 and 6.

Figure 4:
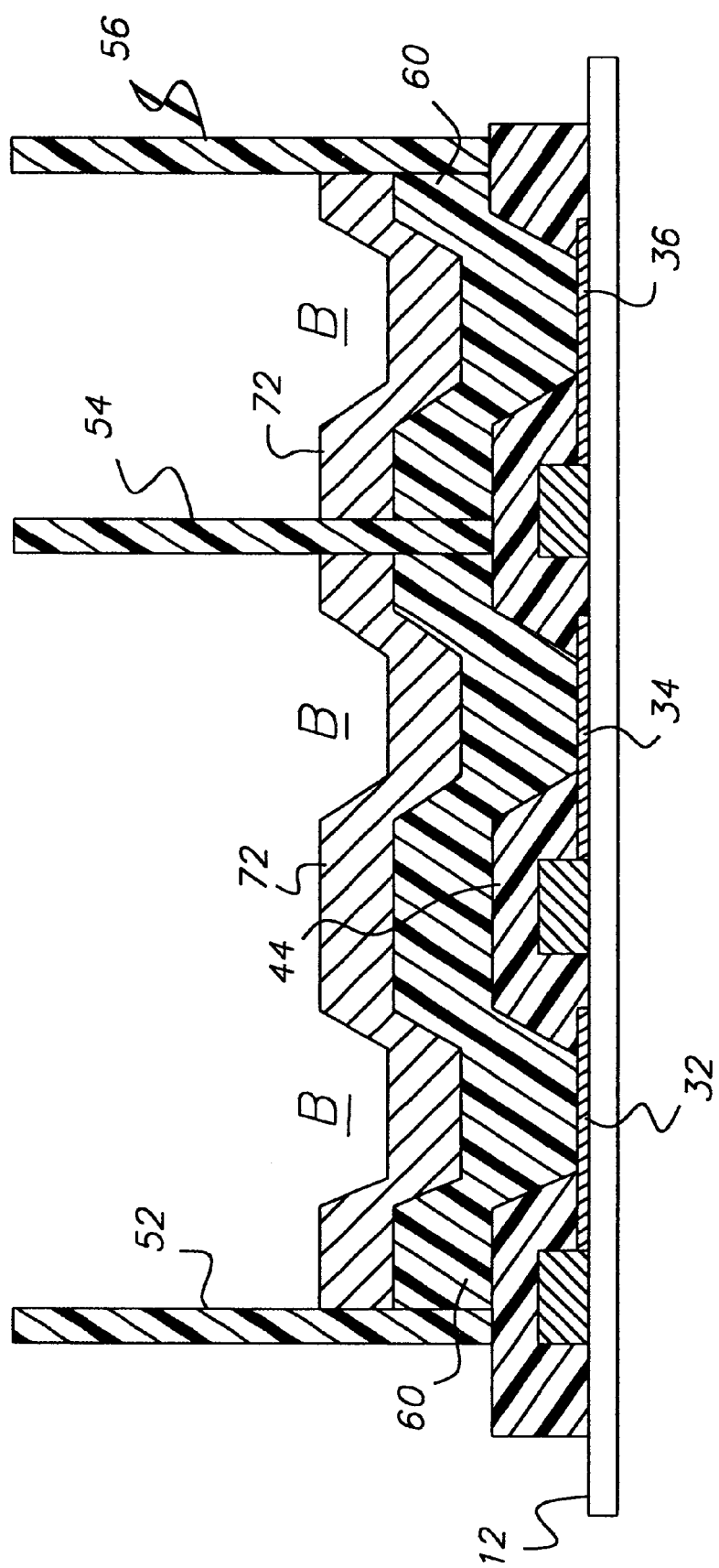

Referring to FIG. 4, an organic electroluminescent layer 60 is formed at least over the exposed portion of each subpixel electrode and over the insulative passivation layers. A common light-transmissive electrode 72 is formed over the organic EL layer 60.

The layer 60 includes an organic light-emitting material capable of emitting light in a blue ("B") spectral region in response to an electrical addressing provided between one of the electrodes 32, 34, or 36 and the light-signal transmissive common electrode 72.

The blue light-emitting organic EL layer 60 is comprised of a plurality of superimposed layers which can include a hole-injecting layer, a hole-transporting layer, a blue light-emitting layer, and an electron-transporting and injecting layer, as detailed in the Tang et al, U.S. Pat. No. 5,294,870, the disclosure of which is hereby incorporated by reference. To preserve visual clarity of the drawings, these superimposed organic layers are depicted here as single layers. It is noted that superimposed layers or multi-layers provide an internal junction between an electron-injecting and transporting zone and a hole-injecting and transporting zone so that hole-electron recombination at the junction provides light-emission therefrom and of a hue which is determined by the light-emitting materials present at the junction or within molecular distances therefrom.

Particularly preferred blue light-emitting organic EL materials are those which emit in a spectral region below 480 nm and which are capable of exciting each of the fluorescent color conversion layers.

The layer 60 (or sublayers thereof) can be formed by conventional vapor phase deposition. The light-transmissive common electrode 72 can be deposited by vapor phase deposition, by sputter deposition, or by electron beam deposition. Preferred light-transmissive electrode materials include indium oxide, zinc oxide, tin oxide, indium-tin oxide (ITO) or combinations of oxides of indium, tin, and zinc, and chromium cermat light-transmissive materials. Such common electrodes have a thickness in a preferred range of 0.01 to 0.5 micrometer, and a transparency greater than fifty percent.

Figure 5:
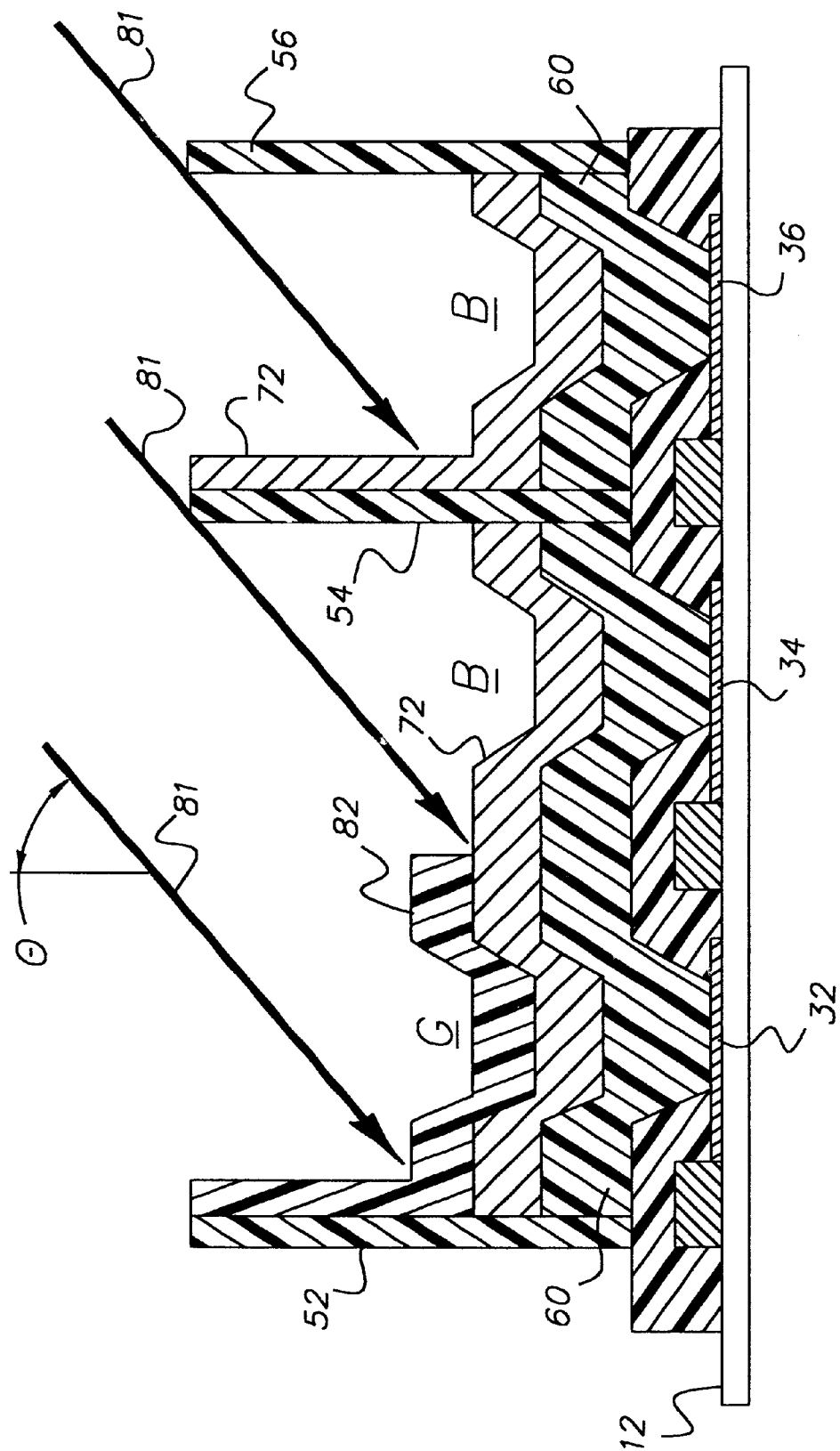

Referring to FIG. 5, a green color conversion vapor deposition stream 81 is shown directed toward the surfaces of the common electrode 72 under an oblique angle Θ with respect to the shadow mask pillars 52, 54, and 56 such that a green ("G") color conversion layer 82 is formed over a portion of the common electrode 72 and overlying the first subpixel electrode 32, and delineated by the shadowing effect of the shadow mask pillar 54. The green color conversion layer extends upwardly along the pillar 52 and the pillar 54 outside of the exposed portions of the pixel electrodes. As indicated previously, layers formed over the top portions of the pillars are not shown in the drawings to preserve clarity of presentation.

Figure 6:
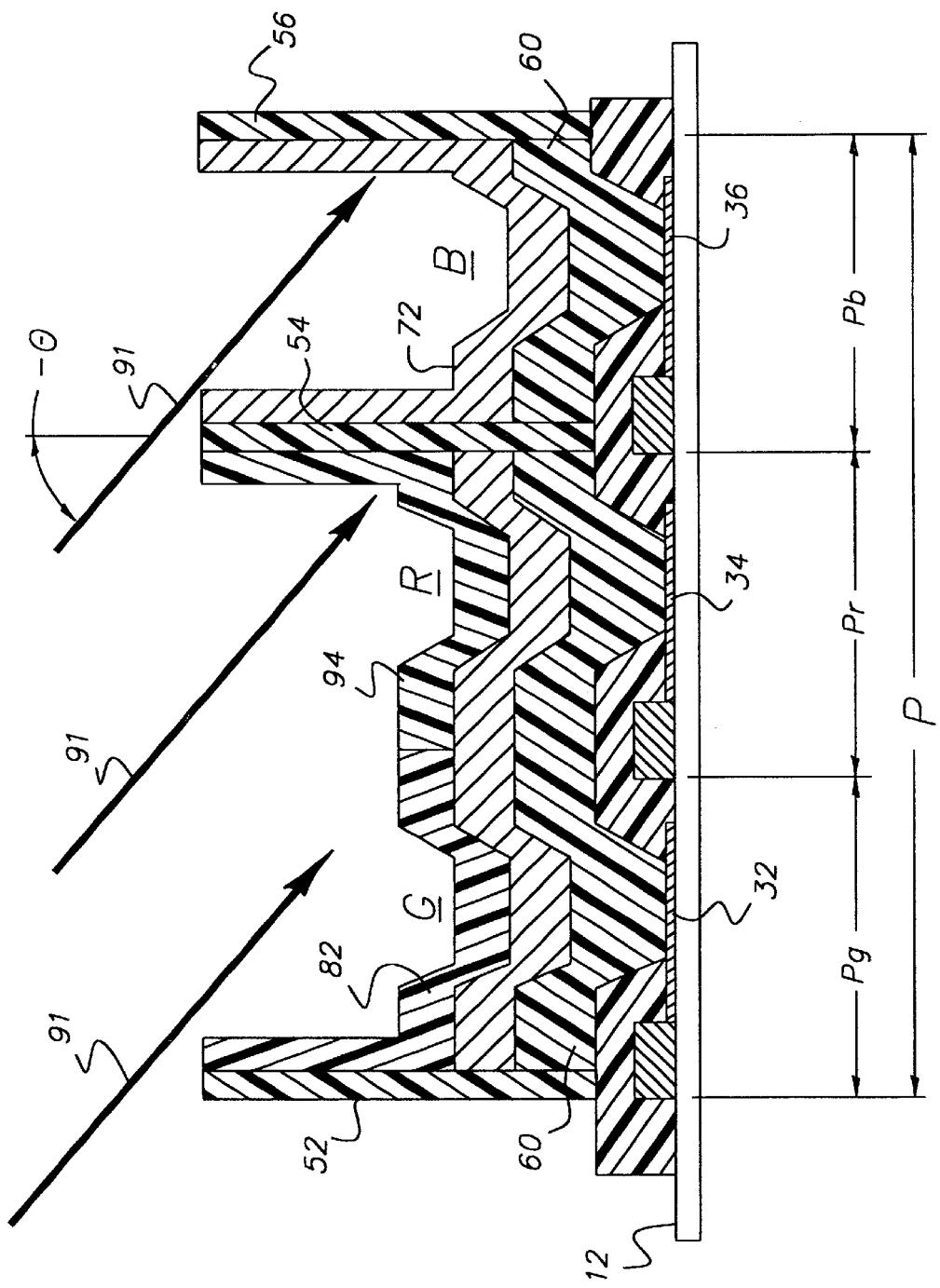

Referring to FIG. 6, a red color conversion vapor deposition stream 91 is now shown incident under an angle −Θ (i.e. in an opposing direction relative to the vapor stream 81). A red color conversion layer 94 ("R") is thereby formed selectively over the common electrode 72 and overlying the exposed portion of the second subpixel electrode 34, and delineated primarily by the shadowing effect of the pillar shadow mask 52. It will be appreciated that a thickness dimension of the color conversion layers 82 and 94 is in a range of 0.02–0.2 micrometer, while the pillar structure shadow masks 52, 54, and 56 have a width dimension (not shown) in a range of 2–10 micrometer. Accordingly, the color conversion layers extending upwardly along the pillars have a negligible effect on the shadow-casting performance of the masks.

Each of the third light-emitting subpixels, identified by the subpixel subelectrodes 36, is not covered by either of the two different color conversion layers 82 and 94, thus remaining capable of emitting blue light ("B"). The color pixel P is comprised of laterally spaced color subpixels pg, pr, and pb.

The color conversion layers 82 and 94 are formed of a single or of a composite fluorescent material capable of efficiently absorbing blue light emitted from the organic electroluminescent layer 60 and efficiently converting the absorbed blue light to provide green and red emissions, respectively. Since a thickness dimension (not shown) of the light-transmissive common electrode 72 is typically smaller than 0.2 micrometer, optical coupling with minimal divergent loss between the blue light-emitting layer 60 and the color conversion layers 82 and 94 is ensured.

Thus, the particular geometric arrangement of this embodiment of the pillar structure shadow masks 52, 54, and 56 with respect to the subpixel electrodes 32, 34, and 36 represents a simple and accurate self-alignment feature for forming a full-color organic light-emitting display which has a plurality of light-emitting pixels. As shown here, adjacent green and red subpixels are defined by and between first pillar structures 52 and second pillar structures 54. Blue subpixels are disposed between second pillar structures 54 and third pillar structures 56.

Referring to the sequence of FIGS. 7–10, there is shown schematically the fabrication of a full-color active matrix organic EL display panel using integrated shadow mask pillar structures of a second embodiment to pattern color conversion (color changing) layers. With few exceptions, numeral designations of like parts are identical to the parts or elements described in FIGS. 1–6, and will therefore not be further detailed.

This embodiment uses only two shadow mask pillar structures 52 and 56 to define three adjacent color subpixels therebetween.

Figure 7:
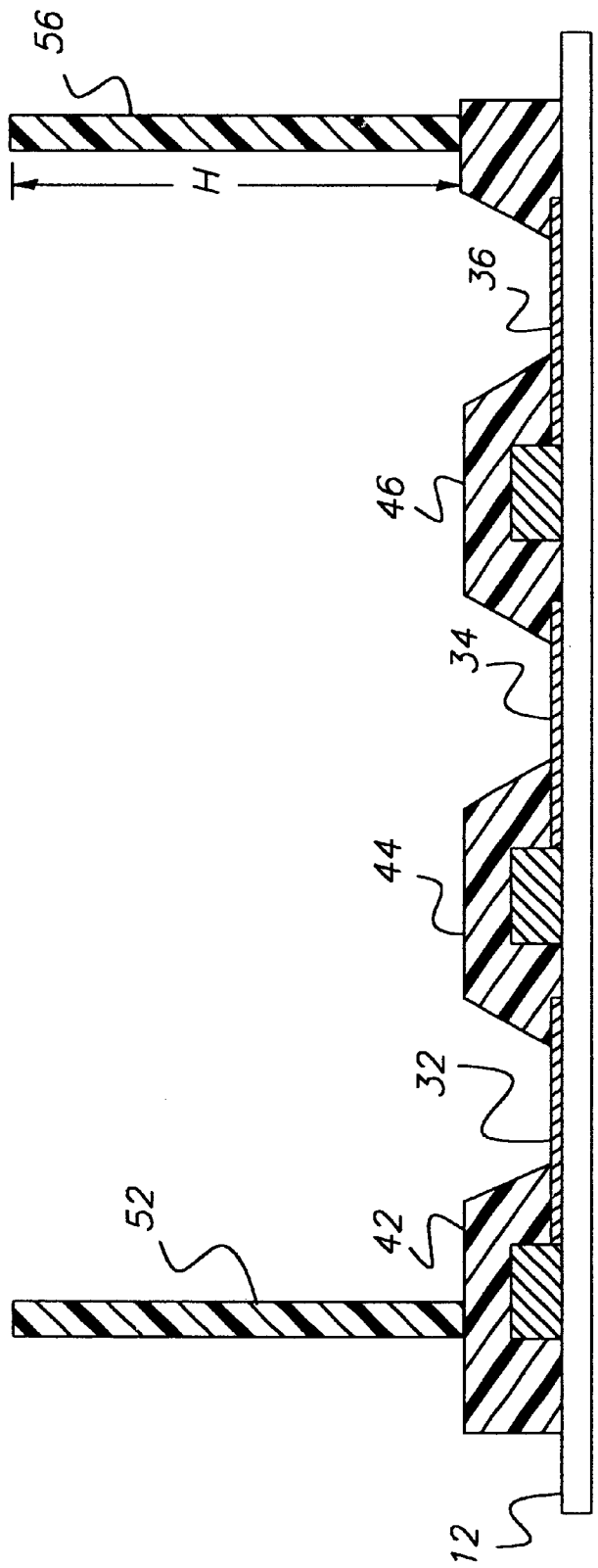

FIG. 7 shows the subpixel electrodes 32, 34, and 36, and associated active matrix electrical addressing elements 22, 24, and 26 as provided in FIG. 2.

Figure 8:
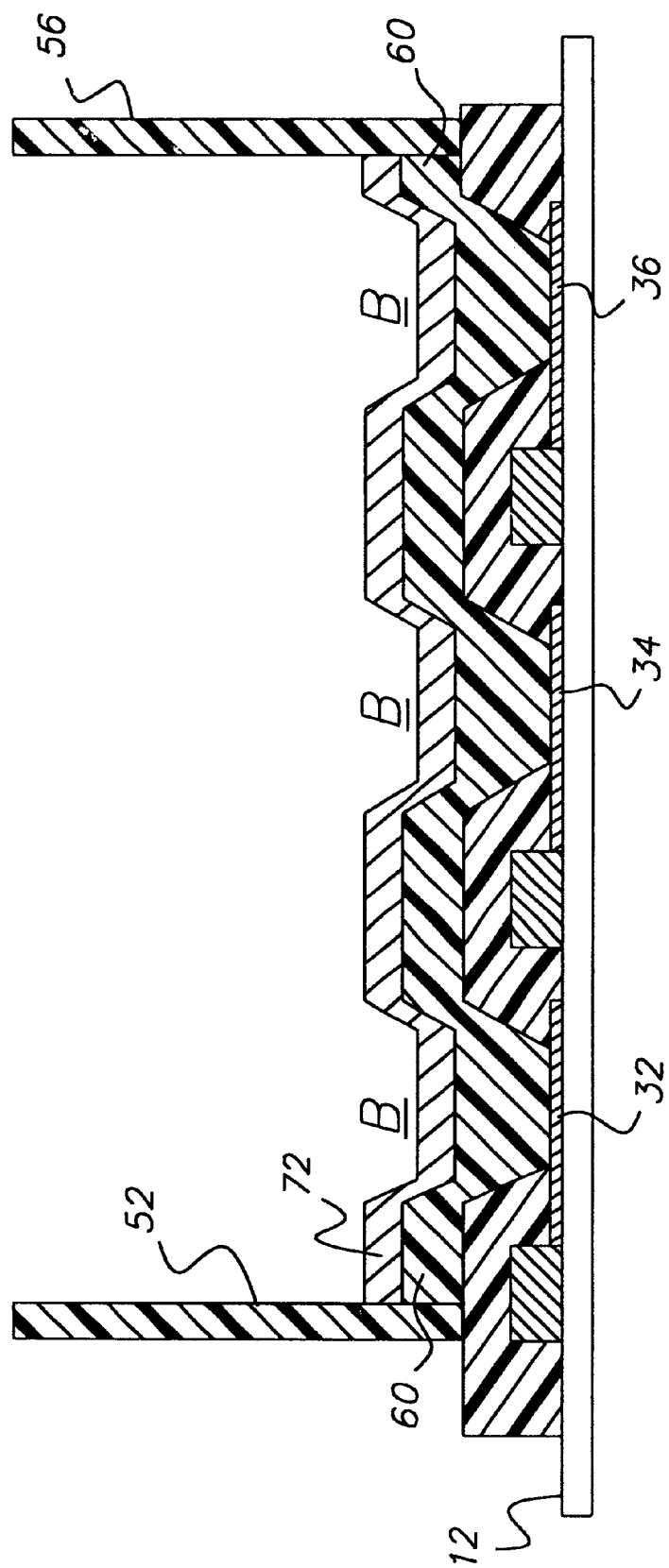

FIG. 8 depicts a blue ("B") light-emitting organic EL layer 60 formed over each subpixel between two pillar structures 52, 56, and a common light-transmissive electrode 72 disposed over the EL layer 60.

Figure 9:
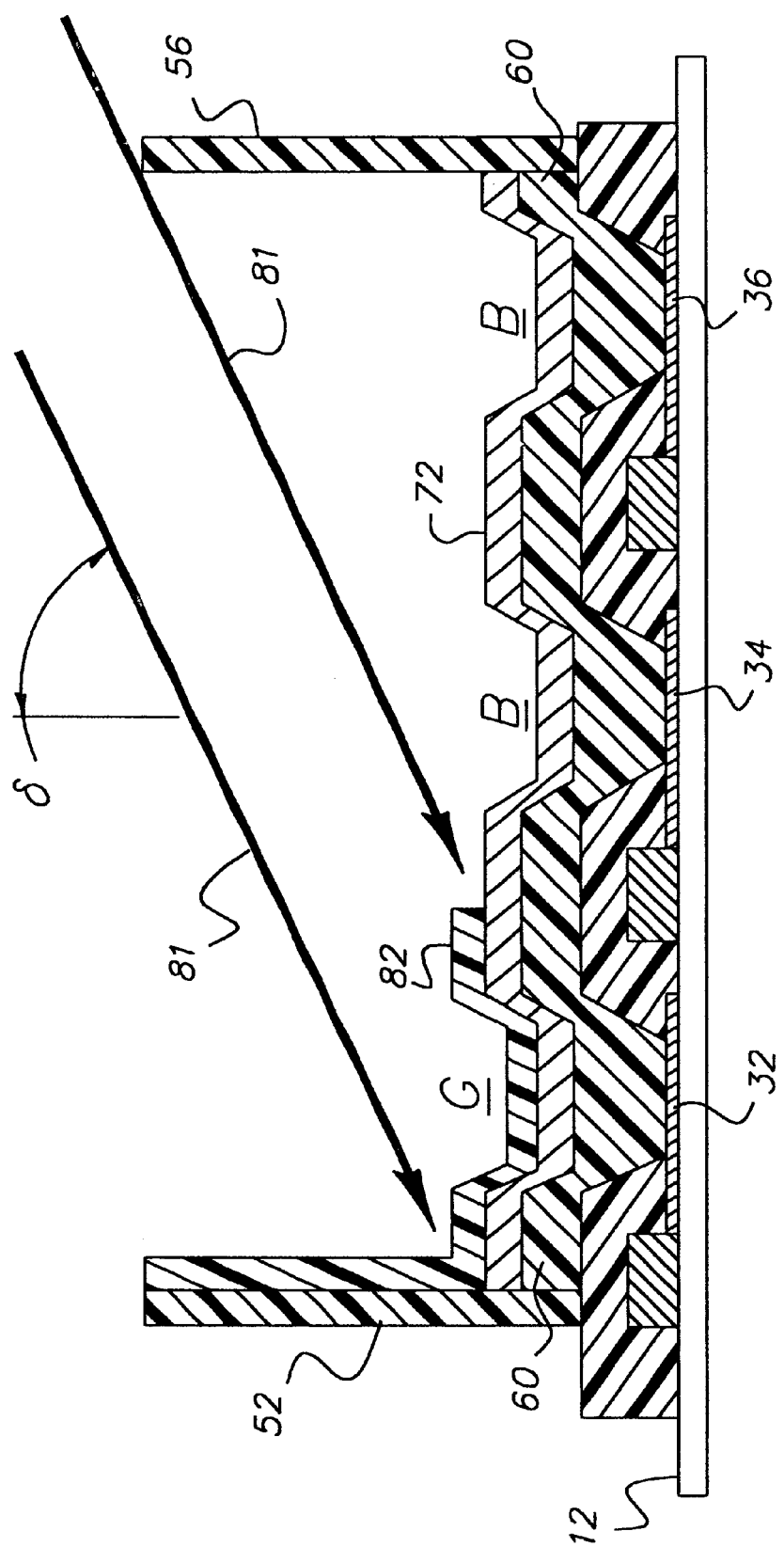

In FIG. 9 is shown the deposition of a green ("G") color changing layer 82 which is selectively patterned in alignment with the designated subpixel electrode 32 by the vapor stream 81 which is incident on the electrode layer 72 under an oblique angle σ with respect to the pillar structures, whereby the pillar structure 56 provides the shadowing or masking effect.

Figure 10:
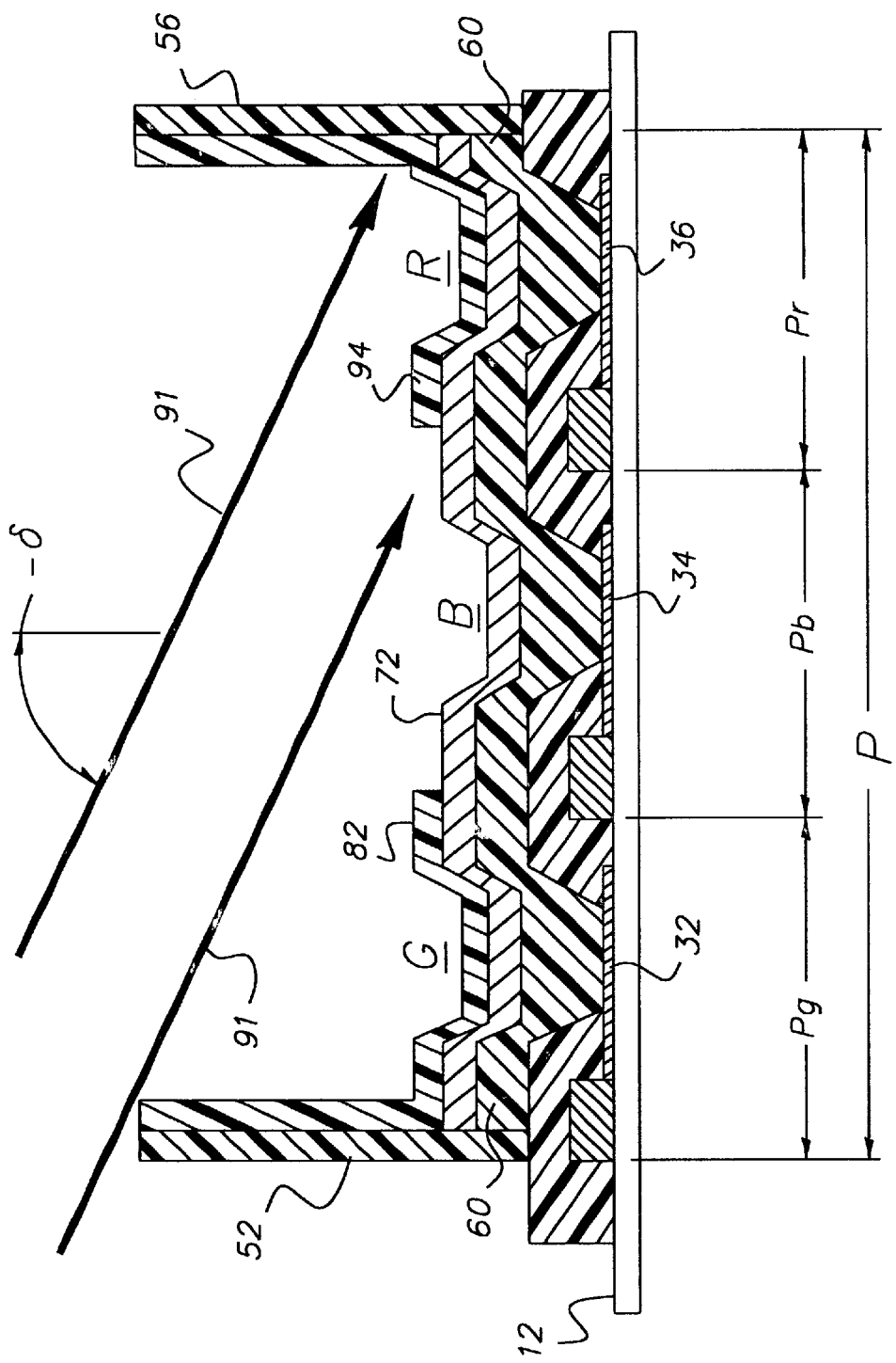

FIG. 10 shows the deposition of a red ("R") color changing layer 94 which is selectively patterned in alignment with the designated subpixel electrode 36 by the vapor stream 91 which is incident on the electrode layer 72 under an oblique angle −σ, whereby the pillar structure 52 now provides the shadowing or masking effect. The centrally disposed blue ("B") light-emitting subpixel has been shadowed or masked from receiving a color changing layer by the mask structures 56 and 52 which selectively intercept the vapor streams 81, 91 at the designated angles σ and −σ.

Thus, in this embodiment of integrated shadow mask pillar structures, color pixels are comprised of three adjacent color subpixels defined and patterned by and between two pillar structures.

Both embodiments (see FIGS. 1–6 and FIGS. 7–10, respectively) of the integrated shadow mask pillar structures of the invention provide a further significant advantage in the fabrication of full-color active matrix organic EL display panels in that primary color subpixels can be fabricated either by selective patterning of color changing layers (color conversion layers) as described above, or alternatively by selective patterning of organic EL layers which are capable of directly emitting red, green, or blue light from corresponding color subpixels. The fabrication of a full-color direct light-emitting organic EL display panel is shown schematically in FIGS. 11–13 with the shadow mask pillar configuration of the second embodiment.

Figure 11:
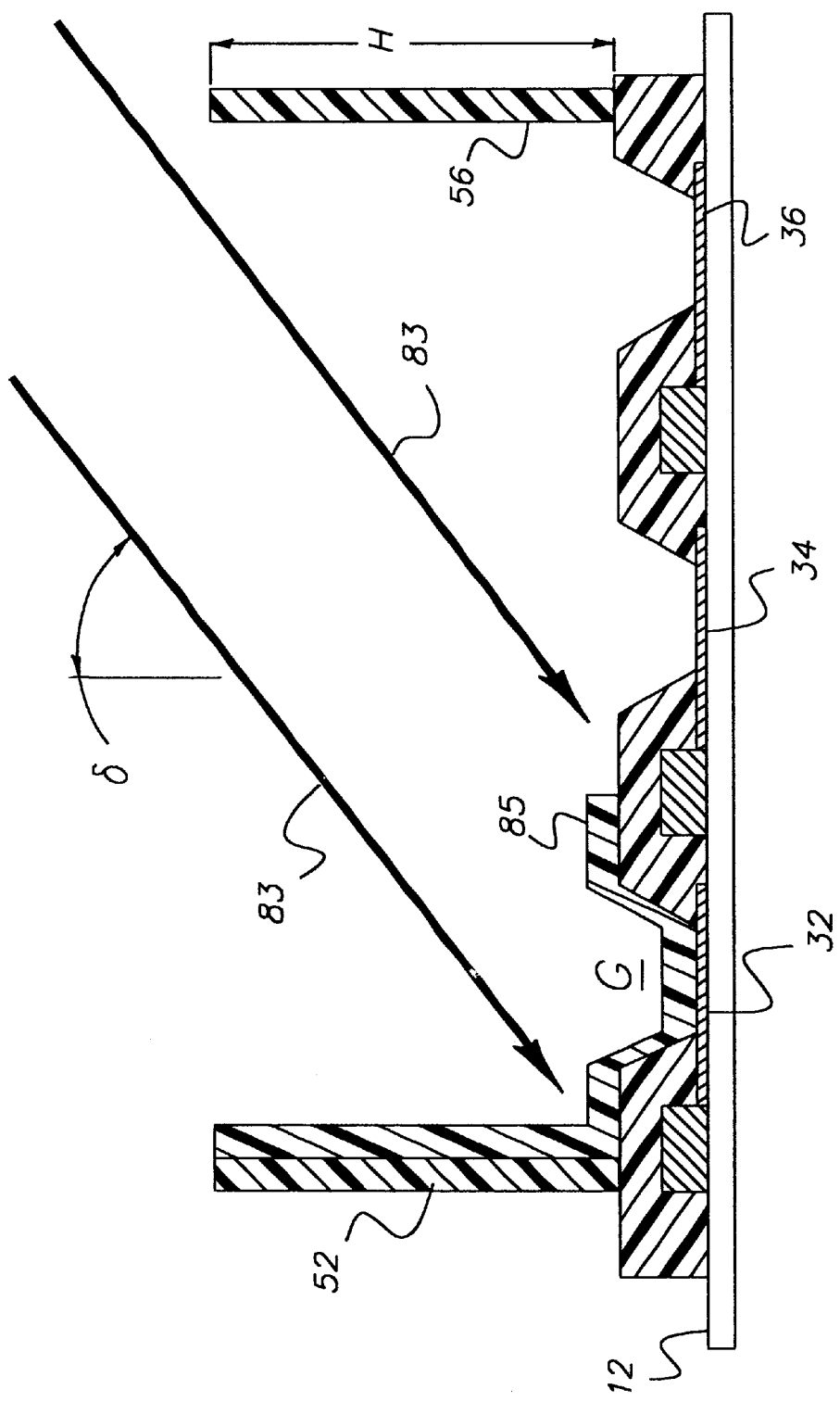

Turning to FIG. 11, a vapor stream 83 of an organic EL medium is directed at the subpixel electrode 32 under an angle σ to form an emissive organic EL layer 85 thereon which is capable of directly emitting green ("G") light.

Figure 12:
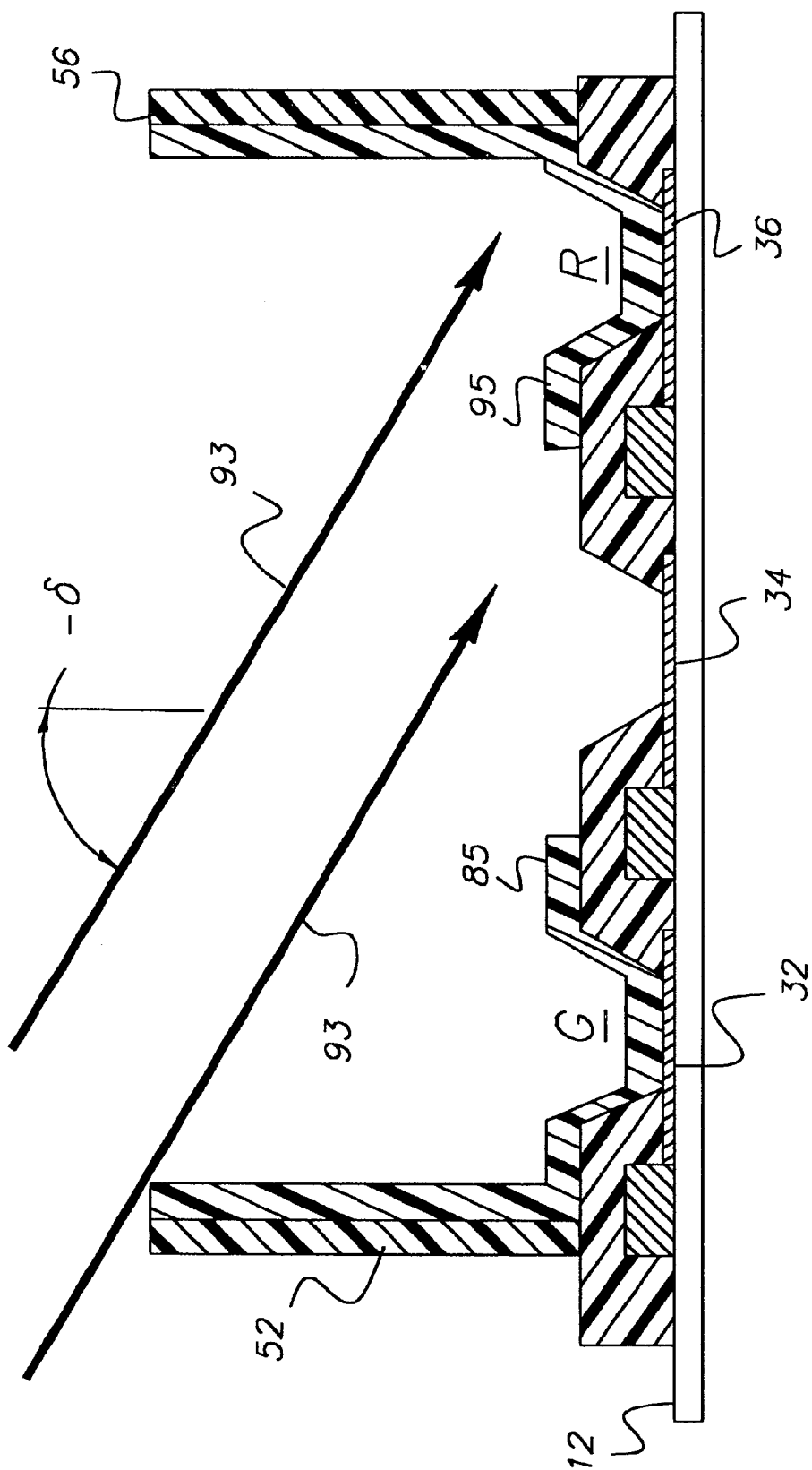

In FIG. 12, a vapor stream 93 of an organic EL medium is directed at the subpixel electrode 36 under an angle −σ to form an emissive organic EL layer 95 thereon which is capable of directly emitting red ("R") light.

Figure 13:
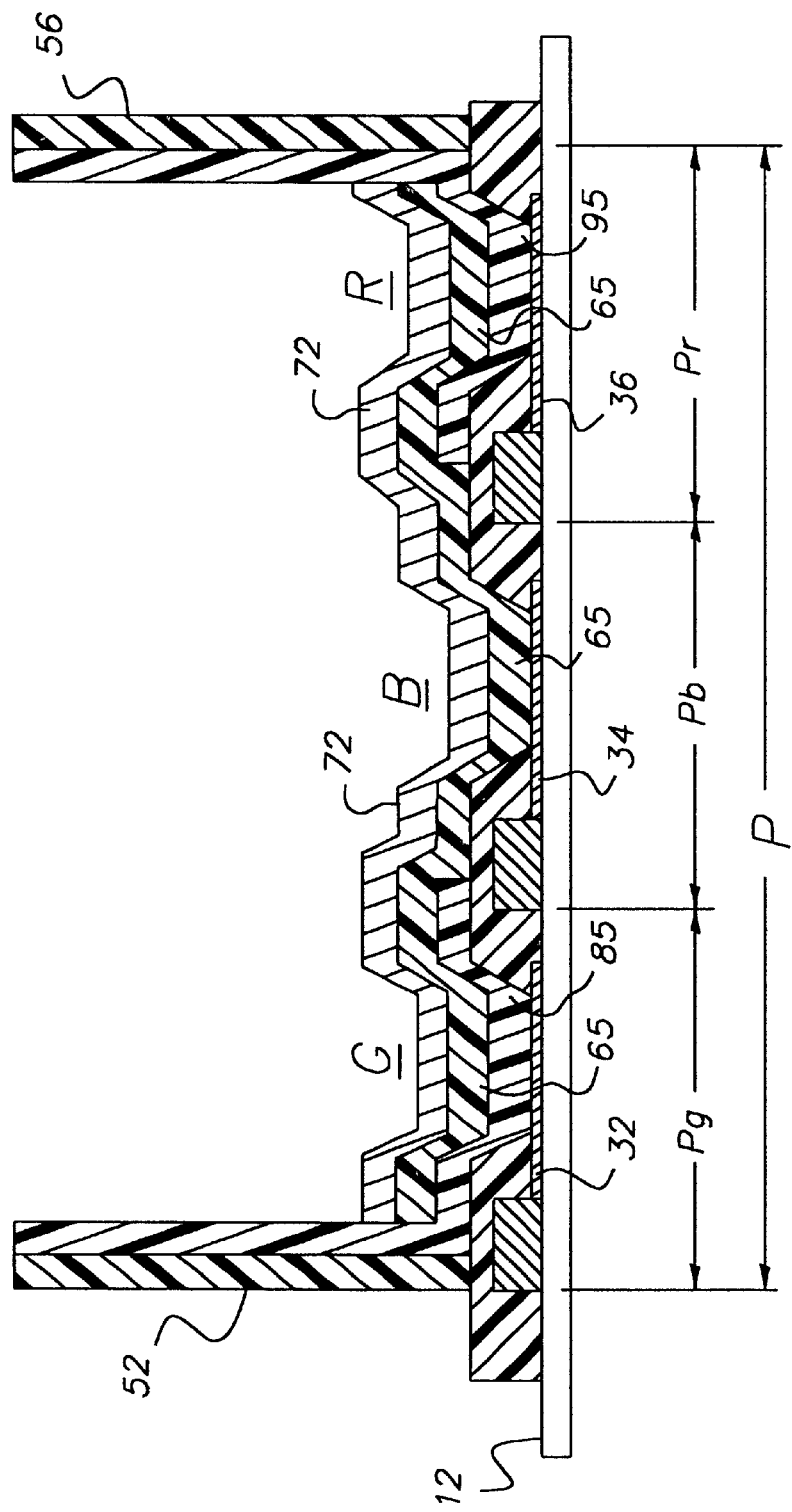

FIG. 13 shows an emissive organic EL layer 65 formed over the central subpixel electrode 34 and over the green and red subpixel layers 85 and 95. A light-transmissive common electrode 72 is disposed over the organic EL layers.

The organic EL layer 65 is capable of directly emitting blue ("B") light, but only in the location over the subpixel electrode 34, because only in this location is the layer 65 forming a light-emitting junction in the previously described arrangement of superimposed organic layers (not shown in the drawings). The green and red emissive layers 65, 95 are comprised of a light-emitting host material and respectively at least one green-emitting fluorescent dopant for the green color subpixels, and at least one red-emitting fluorescent dopant for the red color subpixels, wherein the fluorescent dopants are uniformly dispersed throughout the host material.

The emissive layer 65, capable of producing a blue primary color from the subpixel electrode 34, includes a blue light-emitting organic host material. Blue light-emitting organic host materials can be selected from among those disclosed in U.S. Pat. No. 5,130,603 to Takailin et al, U.S. Pat. No. 5,645,948 to Shi, and U.S. Pat. No. 5,141,671 to Bryan et al, the disclosures of which are herein included as references.

Figure 14:
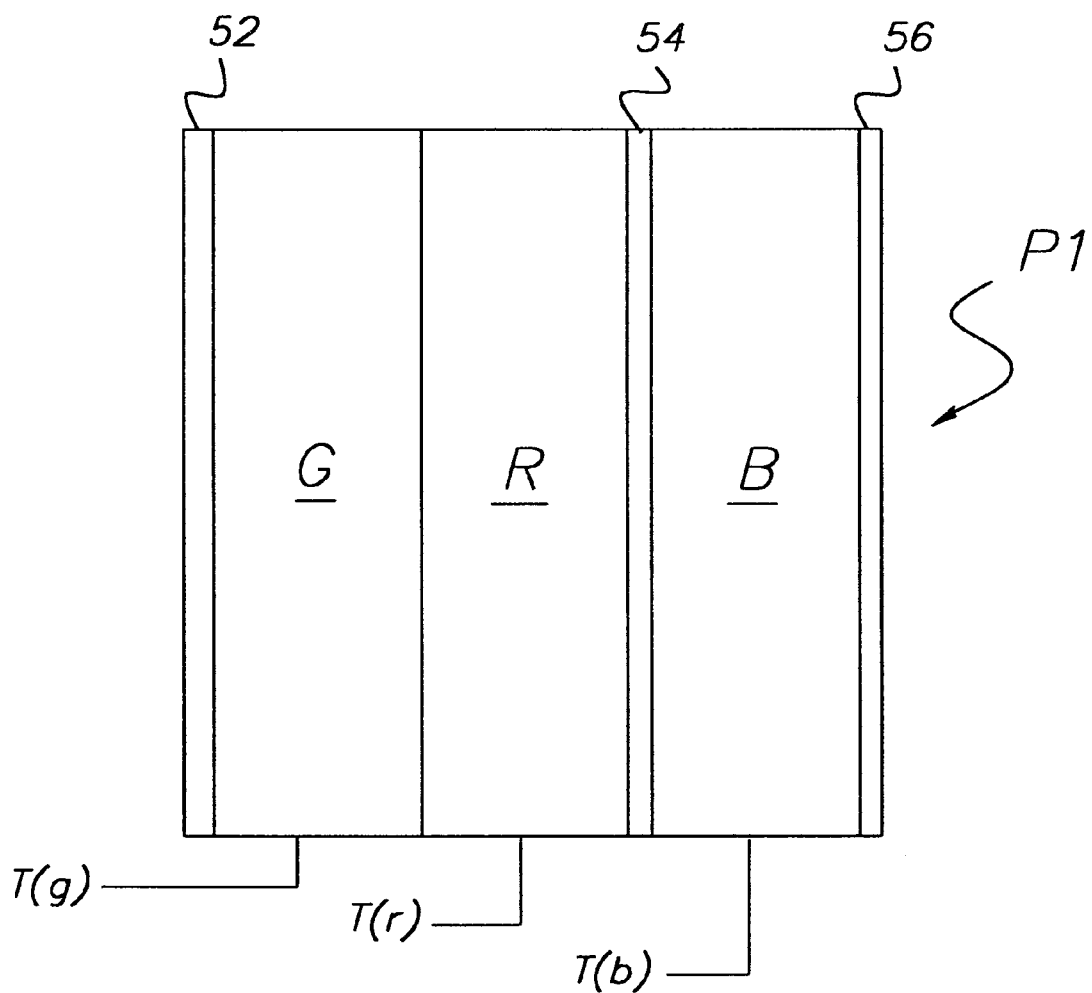

Referring to FIG. 14, it is a plan view of a tri-colored pixel P1 having one green, red, and blue emitting subpixel pg, pr, and pb arranged laterally between shadow mask pillar structures 52, 54, and 56 of the first embodiment in correspondence with the schematic side view of FIG. 6. Transistor elements T(g), T(r), and T(b) are shown schematically to correspond to electrical addressing elements 22, 24, and 26 (see FIG. 1) to provide tri-color light emission.

Figure 15:
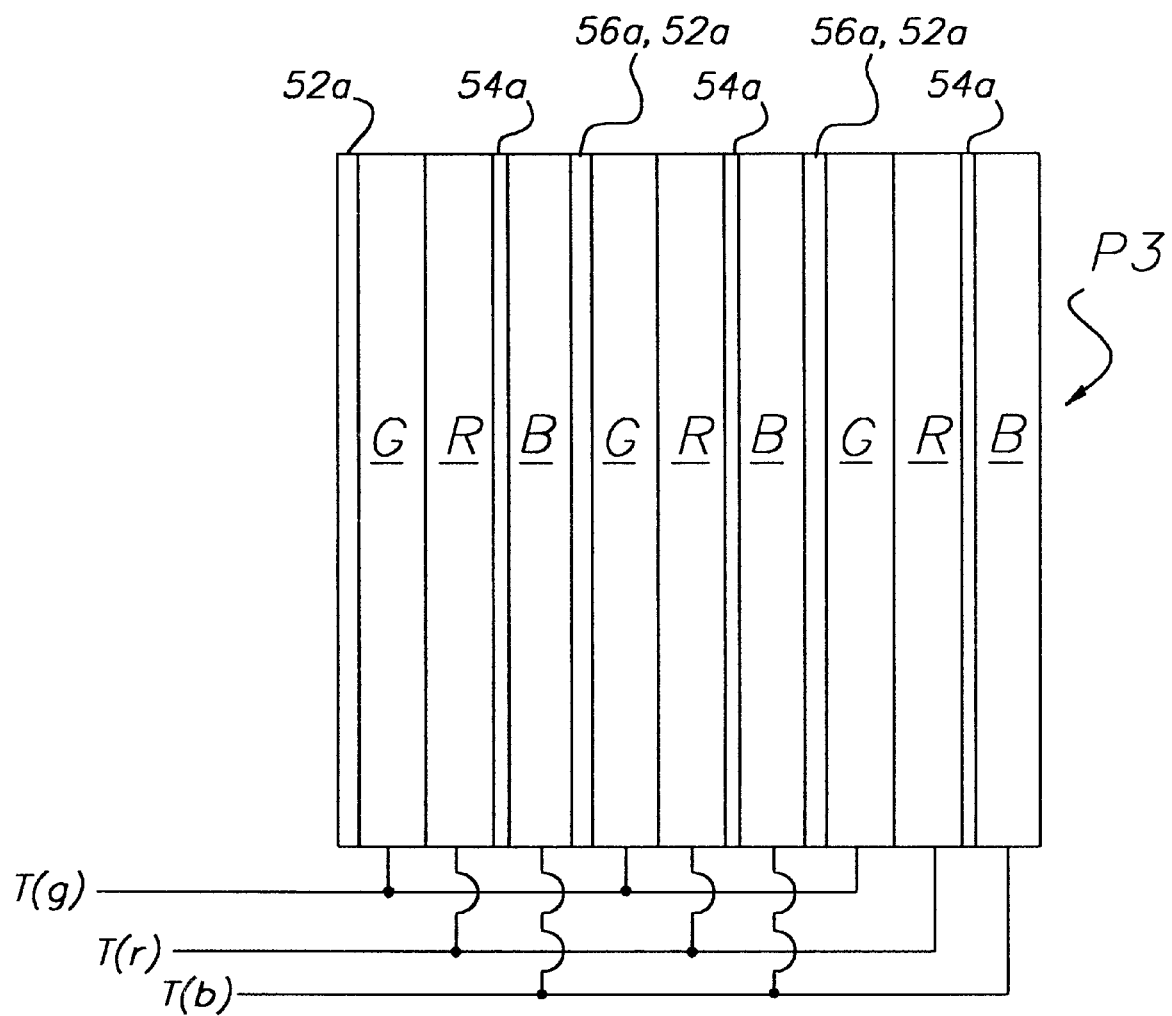

Turning to FIG. 15, a pixel P3 is shown in schematic plan view as having a set of green, red, and blue light-emitting subpixels formed in a repeating pattern of repeat color elements between repeating shadow masks pillar structure designated here as 52a, 54a, and 56a. Each color subpixel comprises three spatially separated color elements having repeating shadow mask pillar structures designated as 52a, 54a, and 56a. The color elements of each color subpixel are electrically connected in parallel to an addressing transistor. Transistor elements T(g), T(r), and T(b) are indicated schematically to address the green, red, and blue color subpixels, respectively. For example, when the addressing element T(g) is actuated, all color elements of the green subpixel of the pixel P3 will be stimulated to emit green light. This construction of full-color pixels P3 is particularly advantageous when pillar structures of a reduced height dimension are desired.

It will be appreciated that a full-color organic light-emitting display having a plurality of light-emitting color pixels arranged in a two-dimensional array will produce an image display comprised of subpixels of tri-color light emission wherein the color subpixels have dimensions sufficiently small (for example, a subpixel dimension in a range of 5–10 micrometer) to provide a high resolution display panel having a color pixel resolution greater than about 2000 dots per inch. Such high resolution full-color displays can be fabricated in accordance with the present invention through appropriate scaling of the addressing elements, the pixel electrodes, and the integrated self-aligning pillar structure shadow masks.

In the drawings, each of the color subpixels of a color pixel has been shown with approximately equal lateral dimensions. It will be appreciated that a color pixel pitch (the lateral spacing between color pixels) can be maintained when it is desired to construct color subpixels having unequal lateral dimensions. For example, all green color subpixels can have an extended lateral dimension to achieve enhanced emission of green light. To retain a desired pitch of color pixels, the lateral dimensions of the red and/or blue subpixels will be reduced commensurately.

The invention has been described in detail with particular reference to certain preferred embodiments thereof, but it will be understood that variations and modifications can be effected within the spirit and scope of the invention.

| PARTS LIST | |
|---|---|
| 12 | substrate |
| 22, 24, 26 | electrical addressing elements |
| 32, 34, 36 | subpixel electrodes |
| 33, 35, 37 | exposed portions of subpixel electrodes |
| 42, 44, 46 | insulative passivation |
| 52, 54, 56 | pillar structure shadow masks of a set of subpixels forming a pixel |
| 52a, 54a, 56a | pillar structure shadow masks of sets of subpixels forming a pixel |
| 60 | blue light-emitting organic EL layer ("B") |
| 65 | blue subpixel organic EL layer |
| 72 | light-transmissive common electrode |
| 81 | green color conversion vapor deposition stream |
| 82 | green color conversion layer ("G") |
| 83 | green EL vapor stream |
| 85 | green subpixel organic EL layer |
| 91 | red color conversion vapor deposition stream |
| 93 | red EL vapor stream |
| 94 | red color conversion layer ("R") |
| 95 | red subpixel organic EL layer |
| G | green |
| R | red |
| B | blue |
| H | height dimension of pillar structures |
| P | color pixel |
| P1 | pixel having one G, R, and B subpixel |
| P3 | pixel having three G, R, and B color elements |

-continued

| PARTS LIST | |
|---|---|
| pb | blue color subpixel |
| pg | green color subpixel |
| pr | red color subpixel |
| T(g) | transistor addressing element for green subpixel(s) |
| T(r) | transistor addressing element for red subpixel(s) |
| T(b) | transistor addressing element for blue subpixel(s) |
| Θ, -Θ | angles of green, red vapor deposition streams (three pillar structure embodiment) |
| σ, -σ | angles of green, red vapor deposition streams (two pillar structure embodiment) |

What is claimed is:

1. A full-color active matrix organic electroluminescent (EL) display panel, comprising:

a) a substrate;

b) a plurality of color pixels formed on the substrate;

c) each color pixel containing three primary color (red, green, and blue) subpixels;

d) an active matrix electrical addressing element associated with each color subpixel;

e) an integrated shadow mask for forming the color subpixels including a plurality of pillar structures erected on the substrate;

f) the pillar structures having a geometric arrangement which permits the formation of each color subpixel independent of the formation of the other two color subpixels and wherein the formation of each color subpixel is provided by a line-of-sight vapor deposition for selective patterning the color subpixel; and a common light-transmissive electrode over the plurality of color pixel;

wherein said vapor deposition in a red, green or blue subpixel extends upwardly along an adjacent pillar beyond the corresponding subpixel.

2. The display panel of claim 1 wherein the active matrix electrical addressing element includes at least one transistor and a subpixel electrode electrically connected thereto.

3. The display panel of claim 2 wherein the substrate is formed of silicon and the at least one transistor is a CMOS transistor.

4. The display panel of claim 2 wherein the substrate is formed of a material selected from the group consisting of glass, quartz, and ceramics, and the at least one transistor is a thin film transistor.

5. The display panel of claim 2 wherein the subpixel electrode is formed of a reflective material.

6. The display panel of claim 1 wherein the geometric arrangement of the pillar structures is selected such that at least two laterally spaced pillar structures are sufficient to define three color subpixels of a color pixel.

7. The display panel of claim 6 wherein the formation of at least two color subpixels is provided by a line-of-sight vapor deposition under oblique angles with respect to the at least two laterally spaced pillar structures to define therebetween the three color subpixels of a color pixel.

8. The display panel of claim 1 wherein the geometric arrangement of the pillar structures is selected such that three laterally spaced pillar structures define three color subpixels of a color pixel.

9. The display panel of claim 8 wherein two adjacent color subpixels are provided between a first and a second pillar structure, and a third color subpixel is provided between the second pillar structure and a third pillar structure.

10. A full-color active matrix organic electroluminescent (EL) display panel, comprising:
  a) a substrate;
  b) a plurality of color pixels formed on the substrate;
  c) each color pixel containing three primary color (red, green, and blue) subpixels;
  d) an active matrix electrical addressing element associated with each color subpixel;
  e) an integrated shadow mask for forming the color subpixels including a pluraltiy of pillar structures erected on the substrate;
  f) the pillar structures having a geometric arrangement which permits the formation of each color subpixel independent of the formation of the other two color subpixels and wherein the formation of each color subpixel is provided by a line-of-sight vapor deposition for selective patterning the color subpixel;
  g) each color sub-pixel having an electroluminescent (EL) emitter with an emissive layer capable of producing a primary color; and
  h) a common light-transmissive electrode over the EL emitter,
wherin said vapor deposition in a red, green or blue subpixel extends upwardly along an adjacent pillar beyond the corresponding subpixel.

11. The display panel of claim 10 wherein the active matrix electrical addressing element includes at least one transistor and a subpixel electrode electrically connected thereto.

12. The display panel of claim 11 wherein the substrate is formed of silicon and the at least one transistor is a CMOS transistor.

13. The display panel of claim 11 wherein the substrate is formed of a material selected from the group consisting of glass, quartz, and ceramics, and the at least one transistor is a thin film transistor.

14. The display panel of claim 11 wherein the subpixel electrode is formed of a reflective material.

15. The display panel of claim 10 wherein the geometric arrangement of the pillar structures is selected such that at least two laterally spaced pillar structures are sufficient to define three color subpixels of a color pixel.

16. The display panel of claim 15 wherein the formation of at least two color subpixels is provided by a line-of-sight vapor deposition under oblique angles with respect to the at least two laterally spaced pillar structures to define therebetween the three color subpixels of a color pixel.

17. The display panel of claim 10 wherein the geometric arrangement of the pillar structures is selected such that three laterally spaced pillar structures define three color subpixels of a color pixel.

18. The display panel of claim 17 wherein two adjacent color subpixels are provided between a first and a second pillar structure, and a third color subpixel is provided between the second pillar structure and a third pillar structure.

* * * * *